(12) United States Patent
Okuda

(10) Patent No.: US 7,602,827 B2
(45) Date of Patent: Oct. 13, 2009

(54) SEMICONDUCTOR LASER AND MANUFACTURING PROCESS THEREFOR

(75) Inventor: Tetsuro Okuda, Kanagawa (JP)

(73) Assignee: NEC Electronics Corporation, Kawasaki (JP)

(*) Notice: Subject to any disclaimer, the term of this patent is extended or adjusted under 35 U.S.C. 154(b) by 311 days.

(21) Appl. No.: 11/124,113

(22) Filed: May 9, 2005

(65) Prior Publication Data

US 2005/0254541 A1 Nov. 17, 2005

(30) Foreign Application Priority Data

May 11, 2004 (JP) .............................. 2004-141386

(51) Int. Cl.
*H01S 3/04* (2006.01)

(52) U.S. Cl. ............. 372/43.01; 372/45.01; 372/45.011; 372/46.01; 372/46.012; 372/50.11; 372/99; 359/569

(58) Field of Classification Search ............... 372/43.01, 372/45.01, 45.011, 46.01, 46.012, 50.11, 372/99, 48
See application file for complete search history.

(56) References Cited

U.S. PATENT DOCUMENTS

| | | | | |
|---|---|---|---|---|
| 4,902,644 | A * | 2/1990 | Wilt | 438/32 |
| 5,982,798 | A * | 11/1999 | Okuda | 372/46.01 |
| 6,493,369 | B2 * | 12/2002 | Funabashi et al. | 372/49.01 |
| 6,642,075 | B2 * | 11/2003 | Takiguchi | 438/32 |
| 2002/0003661 | A1 * | 1/2002 | Nakai | 359/569 |
| 2002/0061046 | A1 * | 5/2002 | Takiguchi et al. | 372/96 |
| 2003/0016448 | A1 * | 1/2003 | Takasuka et al. | 359/569 |
| 2004/0156299 | A1 * | 8/2004 | Sakai et al. | 369/112.1 |

FOREIGN PATENT DOCUMENTS

| | | |
|---|---|---|
| JP | 64-25494 A | 1/1989 |
| JP | 7-176829 | 7/1995 |
| JP | 10-22579 A | 1/1998 |
| JP | 10-93190 | 4/1998 |
| JP | 11-233893 | 8/1999 |
| JP | 11-354887 | 12/1999 |
| JP | 2000-138413 | 5/2000 |

(Continued)

OTHER PUBLICATIONS

Kamite et al "Ultra-High Speed InGaAsP/InP DFB Lasers Emitting at 1.3 micrometer Wavelength" IEEE Journal of Quantum Electronics, vol. 6 (1987), 1054-1058.*

(Continued)

*Primary Examiner*—Minh-Loan T Tran
*Assistant Examiner*—Fei Fei Yeung Lopez
(74) *Attorney, Agent, or Firm*—McGinn IP Law, PLLC

(57) ABSTRACT

There is provided a semiconductor laser comprising an n-InP substrate 1; a multilayer film including a strained MQW active layer 6 on the n-InP substrate 1;
  a p-electrode 18 on the multilayer film;
  a pair of grooves 15 separating the multilayer film in both edges of the p-electrode 18 and extending to the n-InP substrate 1; and
  a plurality of diffraction gratings formed in an area from one to the other of the pair of grooves 15 in a diffraction grating forming surface formed in the upper surface of the n-InP substrate 1 or the upper surface of any of the semiconductor films in the multilayer film.

16 Claims, 12 Drawing Sheets

FOREIGN PATENT DOCUMENTS

JP          2004-95806       3/2004

OTHER PUBLICATIONS

Kamite et al ("Ultra-High Speed InGAsP/InP DFB Lasers Emitting at 1.3 mm Wavelength" IEEE Journal of Quantum Electronics, vol. 6, Jun. 1987).*

Kiyotsugu Kamite, et al., "Ultra-High Speed InGaAsP/InP DFB Lasers Emitting at 1.3 um Wavelength", IEEE Journal of Quantum Electronics, 1987, vol. QE-23, No. 6, pp. 1054-1058.

A. Valster, et al., "Improved High-Frequency Response of InGaAsP Double-Channel Buried-Heterostructure Lasers", Electronics Letters, 1996, vol. 22, No. 1, pp. 17-18.

Bo Lu, et al., "High-speed low-parasitic low-divergence 635nm singlemode lasers", Electronics Letters, 1998, vol. 34, No. 18, pp. 1750-1751.

Chinese Office Action dated Feb. 16, 2007 and English translation.

Japanese Office Action dated Nov. 18, 2008, with partial English translation.

Japanese Office Action dated Jun. 30, 2009 and partial English translation thereof.

* cited by examiner

SEMICONDUCTOR LASER AND MANUFACTURING PROCESS THEREFOR

This application is based on Japanese patent application NO. 2004-141386, the content of which is incorporated hereinto by reference.

BACKGROUND OF THE INVENTION

1. Field of the Invention

This invention relates to a semiconductor laser and a manufacturing process therefor.

2. Description of the Related Art

A distributed feedback type semiconductor laser (DFB laser) or distribution Bragg reflection type semiconductor laser (DBR laser) oscillates in a single longitudinal mode and is widely used as a light source for a middle- or long-distance optical communication. In terms of a DFB laser or DBR laser, electron beam lithography has been extensively applied to forming a diffraction grating pattern in order to form a uniform pattern over a whole area with its period being closely controlled.

Japanese Patent Application Nos. 2000-138413 and 1999-354887 have disclosed a technique in terms of a drawing end in such a diffraction grating. According to these references, an average height of a concave bottom after etching is generally different between areas with and without a diffraction grating, in a DFB laser whereby a diffraction grating is formed by electron beam lithography. Thus, when, for example, an active layer is grown on a substrate having this diffraction grating, a step is sometimes formed particularly near a boundary between the areas with and without the diffraction grating, leading to deterioration in crystal quality in a growth layer.

For dealing with the phenomenon, Japanese Patent Application No. 2000-138413 has disclosed a technique that a diffraction grating pattern is formed by electron beam lithography while an area without diffraction grating is exposed to Deep UV. Thus, an area covered by a resist can be reduced to minimize a step between the areas with and without a diffraction grating. Japanese Patent Application No. 1999-354887 has disclosed a technique for dealing with the phenomenon that a step formed after etching can be controlled by modifying an exposure pattern.

As means for reducing a capacity due to a current block layer when constructing a mesa-electrode type structure in a buried waveguide type semiconductor laser to permit high-speed response, there have been disclosed a mesa-electrode structure in which grooves are formed in both ends of an active layer, by K. Kamite, H. Sudo, M. Yano, H. Ishikawa, H. Imai, "Ultra-High speed InGaAsP/InP DFB lasers emitting at 1.3 μm wavelength", IEEE Journal of Quantum Electronics, 1987, Volume QE-23, No. 6, pp. 1054-1058 and A. Valster, L. J. Meuleman, P. I. Kuindersma, T. V. Dongen, "Improved High-frequency Response of InGaAsP Double-channel Buried-heterostructure lasers", Electronics Letters, 1986, Vol. 22, No. 1, pp. 17-18. In this structure, a pn-current block layer which may cause a device capacity is omitted to reduce a pn junction area for minimizing a capacity.

For a ridge waveguide type layer, there has been also disclosed, as means for reducing a device capacity, a structure in which an active layer area not contributing light emission is separated by a groove, by L. Bo, E. Vail, J. S. Osinski, B. Schmitt, "High-speed low-parasitic low-divergence 635 nm single mode lasers", Electronics Letters, 1998, Vol. 34, No. 18, pp. 1750-1751. By the structure, a ridge waveguide type laser may have a reduced capacity to achieve high-speed response.

In the prior art described in these references, there is room for improvement in respect to the followings.

First, the technique in Japanese Patent Application No. 2000-138413, has a problem that when a diffraction grating is deep, a step tends to be formed, probably leading to deterioration in crystal quality. Furthermore, a separate step of Deep UV exposure results in increase in the number of production steps.

Second, the technique in Japanese Patent Application No. 11-354887 has a problem that the technique is effective to some extent to a step in a direction of a laser cavity, but is insufficiently effective for improving depth distribution in a direction perpendicular to an axial direction of the cavity.

Third, the methods disclosed by Kamite, et al., A. Valster, et al. and L. Bo, et al. are directed to reducing a device capacity for improving high-speed response properties of a device, but not to preventing deterioration in crystal quality due to drawing ends of a diffraction grating or deteriorated properties or reliability associated therewith.

SUMMARY OF THE INVENTION

In view of the situation, a non-limiting objective of this invention is to consistently provide a semiconductor laser with good crystal quality in its current injection area.

According to an aspect of this invention, there is provided a semiconductor laser comprising a semiconductor substrate; a multilayer film including an active layer on the semiconductor substrate; an electrode on the multilayer film; a pair of grooves separating the multilayer film in both edges of the electrode and extending to the semiconductor substrate; and a plurality of diffraction gratings formed in an area from one to the other of the pair of grooves in a diffraction grating forming surface formed in the upper surface of the semiconductor substrate or the upper surface of any of the semiconductor films in the multilayer film.

According to this configuration, there are no diffraction-grating drawing ends in the diffraction grating forming surface. Thus, a proportion of an area with deteriorated crystal quality may be reduced in the current-injected area, so that a high-quality semiconductor laser can be consistently provided.

The above semiconductor laser may have a configuration that the concave bottom in the plurality of diffraction gratings in the area from one to the other of the pair of grooves is substantially flat in a direction along the diffraction gratings.

This configuration allows a semiconductor film deposited over the diffraction grating surface to have good crystal quality and reduces a proportion of an area with deteriorated crystal quality in the area to be current-injected, so that a high-quality semiconductor laser can be consistently provided.

Alternatively, the above semiconductor laser may have a configuration that it further comprises a plurality of diffraction gratings outside the pair of grooves to the electrode.

According to this configuration, there are no drawing ends of a diffraction grating in an area to be current-injected, so that a proportion of an area with deteriorated crystal quality in the area to be current-injected is reduced and thus a high-quality semiconductor laser can be consistently provided.

In the above semiconductor laser, the concave bottom in the plurality of diffraction gratings formed outside the pair of grooves may be formed such that in the ends of the plurality of diffraction gratings, the bottom is lower than the concave bottoms of the plurality of diffraction gratings in the remaining area.

According to this configuration, the area lower than the concave bottoms of the diffraction gratings in the remaining area is outside the area to be current-injected, so that a proportion of an area with deteriorated crystal quality in the area to be current-injected is reduced and thus a high-quality semiconductor laser can be consistently provided.

The above semiconductor laser may further comprise a pair of current blocking areas separating the multilayer film and extending to the semiconductor substrate in the area between the pair of grooves.

According to this configuration, a current is further spatially limited in a direction perpendicular to a current direction, to further improve optical containment effect by an optical gain, so that a semiconductor layer with a higher luminous efficiency can be consistently provided.

In the semiconductor laser, a distance between the centers of the pair of grooves may be 10 μm or more.

According to this configuration, the widths of the multilayer film including an active layer between the pair of grooves and of the electrode on the multilayer film can be increased, so that allowance for alignment precision in exposure can be increased, resulting in improved stability in semiconductor laser production.

In the above semiconductor laser, a width of the diffraction grating forming surface may be 5 μm or more.

According to this configuration, the diffraction grating forming surface has a relatively larger width, so that a plurality of diffraction gratings can be formed in an area from one to the other of the pair of grooves. Thus, a proportion of an area with deteriorated crystal quality in the area to be current-injected is reduced and thus a high-quality semiconductor laser can be consistently provided.

The above semiconductor laser may be a distributed feedback type semiconductor laser.

According to this configuration, forming the diffraction gratings can lead to a cavity reflecting light with a particular wavelength, so that a semiconductor laser capable of good oscillation in a single mode can be consistently provided.

According to another aspect of this invention, a process for manufacturing a semiconductor laser comprising the steps of forming a multilayer film including an active layer on a semiconductor substrate; separating the multilayer film to form a pair of groove extending into the semiconductor substrate; and forming an electrode on the multilayer film between the pair of grooves, wherein the step of forming the multilayer film on the semiconductor substrate comprises forming a plurality of diffraction gratings on a diffraction grating forming surface formed in the upper surface of the semiconductor substrate or the upper surface of any of the semiconductor films in the multilayer film, and the step of forming the pair of grooves comprises removing both ends of the plurality of diffraction gratings or a pair of areas inside these ends.

According to this process, the drawing ends of the diffraction gratings in the diffraction grating are removed by the pair of grooves or separated from an area to be current-injected by the pair of grooves. Thus, a proportion of an area with deteriorated crystal quality may be reduced in the current-injected area, so that a high-quality semiconductor laser can be consistently provided.

In the above process for manufacturing a semiconductor laser, the step of forming diffraction gratings may comprise forming a plurality of diffraction gratings in the diffraction grating forming surface by electron beam lithography.

This process can more precisely form diffraction gratings with highly flexible and a finer period in comparison with holographic lithography or lithography via a mask, so that a high-quality semiconductor laser may be consistently provided.

Although the configurations of this invention have been described, any arbitrary combination of these configurations may be effective as an aspect of this invention. Furthermore, an expression of this invention in any other category may be effective as an aspect of this invention.

For example, the diffraction grating forming surface described above may be formed in, the upper surface of the semiconductor substrate, but not limited to such a configuration. For example, it may be formed in the upper surface of an optical guide layer below the active layer formed on the semiconductor substrate. Alternatively, it may be formed in the upper surface of a clad layer below the active layer formed on the semiconductor substrate.

According to this invention, a semiconductor laser having a current-injection area with good crystal quality can be consistently provided because it has a diffraction grating with a particular configuration.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

There will be described some embodiments of this invention with reference to the drawings. In all of these figures, analogous components have the same symbols, whose description is omitted as appropriate.

Embodiment 1

Figure 1A:
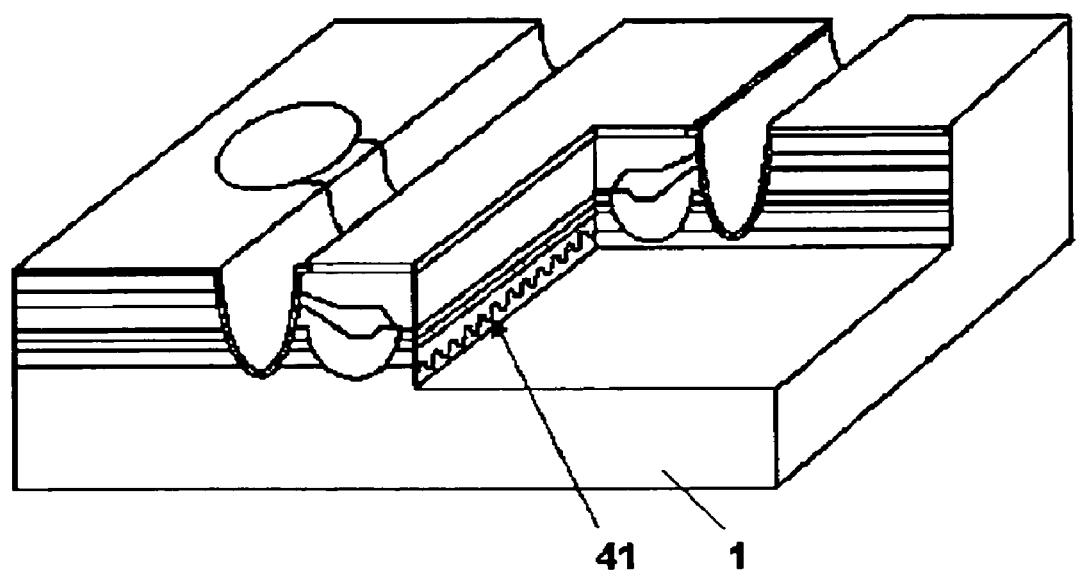
FIGS. 1A and 1B are a perspective and a cross-sectional views schematically showing a laser structure according to an embodiment, respectively.
Figure 1B:
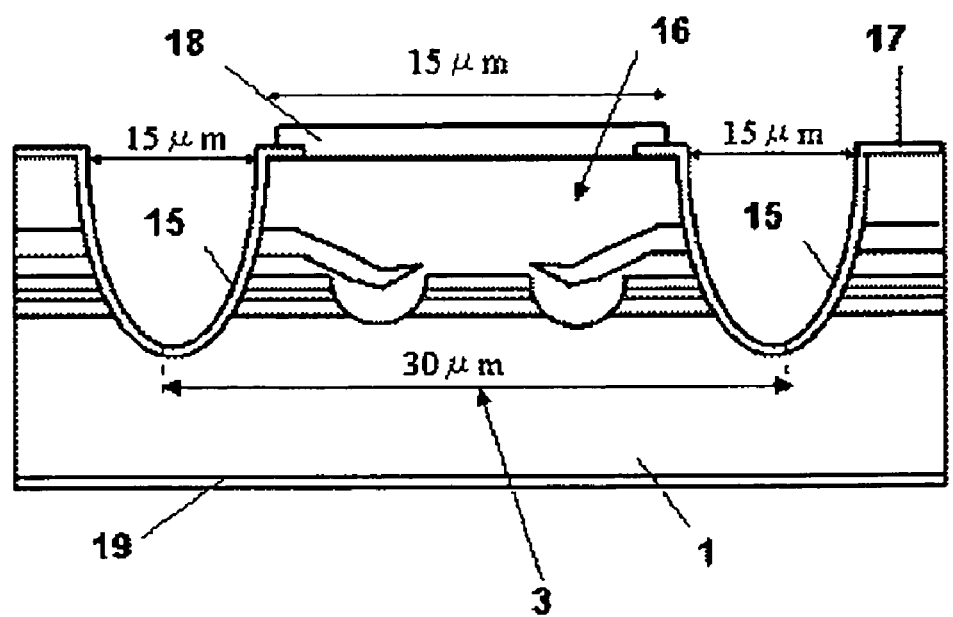

FIGS. 1A and 1B show a structure of a semiconductor laser of this embodiment. A semiconductor laser in FIG. 1A is a buried-heterostructure DFB laser (distributed feedback type semiconductor laser) or DBR laser (distribution Bragg reflection type semiconductor laser) in which diffraction gratings 41 are formed on an n-InP substrate 1 by an appropriate method such as electron beam lithography.

The semiconductor laser comprises a semiconductor substrate (n-InP substrate 1); a multilayer film including an active layer (strained MQW active layer 6) on the semiconductor substrate; an electrode (p-electrode 18) on the multilayer film; a pair of grooves (grooves 15) separating the multilayer film in both edges of the electrode and extending to the semiconductor substrate; and a plurality of diffraction gratings formed in an area from one to the other of the pair of grooves in a diffraction grating forming surface formed in the upper surface of the semiconductor substrate or the upper surface of any of the semiconductor films in the multilayer film.

FIG. 1(b) is a cross-sectional view of the buried-heterostructure DFB laser. The electrode has a mesa structure which is sandwiched between two grooves, and a drawing end of a diffraction grating is at a position where each groove 15 is to be formed. For example, when a width of an electrode mesa structure 16 is 15 mm and a width of a groove 15 is 15 mm, a diffraction grating drawing area 3 has a width of 30 mm.

The pair of grooves 15 are striped grooves extending to one direction and are parallel to each other. These two grooves 15 are partially formed in the n-InP substrate 1. The bottom of each of these two grooves 15 may be in contact with the upper surface of the n-InP substrate 1. These grooves 15 play a role of a so-called device separating groove.

More specifically, a distributed feedback type semiconductor laser manufactured by forming diffraction gratings in only a part of a wafer by an appropriate method such as electron beam lithography has a configuration that there is not a drawing end of a diffraction grating 41 within an electrode mesa separated by two grooves 15 extending into the n-InP substrate 1 with the diffraction gratings. Thus, the diffraction grating drawing area 3 consisting of a plurality of diffraction gratings 41 is formed over the whole width of the electrode mesa separated by the two grooves 15, so that possible deterioration in properties or reliability of a semiconductor laser device due to a drawing end of the diffraction grating 41 can be reduced.

Briefly, in this configuration, there are no drawing ends 4 of a diffraction grating in the diffraction grating forming surface. Thus, a proportion of an area with deteriorated crystal quality in the area to be current-injected is reduced and thus a high-quality semiconductor laser can be consistently provided.

The above semiconductor laser is a buried-heterostructure DFB laser (distributed feedback type semiconductor laser) or DBR laser (distribution Bragg reflection type semiconductor laser) and has the diffraction gratings. Thus, a cavity reflecting light with a particular wavelength can be provided so that a semiconductor laser capable of good oscillation in a single mode can be consistently provided.

The above semiconductor laser has a pair of current blocking areas separating a multilayer film and partially extending into the InP substrate 1 in an area between two grooves 15. The bottom of each of the pair of current blocking areas may be in contact with the upper surface of the n-InP substrate 1. The pair of current blocking areas may be made of a high-resistance material or may be a member capable of blocking a current by pn blocking.

Since the laser comprises a pair of current blocking areas as described above, a current is further spatially limited in a direction perpendicular to a current direction, to further improve optical containment effect by an optical gain, so that a semiconductor layer with a higher luminous efficiency can be consistently provided.

The above semiconductor laser comprises an optical waveguide structure which confines light in a strained MQW active layer 6 in a electrode mesa structure 16 while confining a current. Thus, a semiconductor laser capable of good oscillation in a single mode can be consistently provided.

The diffraction grating drawing area 3 sandwiched by two grooves 15 has a width of, for example, 5 μm or more, preferably 10 μm or more, particularly preferably 15 μm. When the width of the diffraction grating drawing area 3 is equal to or larger than the lower limit, allowance for alignment may be advantageously increased in a production process for a semiconductor laser, resulting in improved production stability.

The diffraction grating drawing area 3 has a width of, for example, 100 μm or less, preferably 50 μm, particularly preferably 30 μm. When the width of the diffraction grating drawing area 3 is equal to or less than the upper limit, a throughput may be advantageously increased in the step of forming diffraction gratings by laser drawing.

In this embodiment, the electrode in the upper surface of the 2 electrode mesa structure 16 has a width of 15 μm and a distance between the centers of two grooves 15 is 30 μm. Therefore, a width of the diffraction grating drawing area 3 in a semiconductor laser according to this embodiment is within the above limits. As a result, the structure of the semiconductor laser in this embodiment is advantageous in that it realizes good balance between production stability and a production throughput.

A distance between the centers of the two grooves 15 is, for example, 10 μm or more, preferably 20 μm or more, particularly preferably 30 μm or more. When the distance between the centers of the two grooves 15 is equal to or larger than the lower limit, allowance for alignment may be advantageously increased in a production process for a semiconductor laser, resulting in improved production stability in the step of forming the grooves 15 by a method such as wet etching.

A distance between the centers of the two grooves 15 is, for example, 150 μm or less, preferably 100 μm, particularly preferably 50 μm. When the distance between the centers of the two grooves 15 is equal to or less than the upper limit, the width of the diffraction grating drawing area 3 between the two grooves 15 is correspondingly reduced, so that a throughput may be advantageously increased in the step of forming diffraction gratings by laser drawing.

In a practical semiconductor laser having a gain waveguide structure in which a current injection area is limited by two grooves 15 typically in this embodiment, a structure having a relatively wider width of the electrode mesa structure 16 as described above is employed in the light of improving product stability.

However, in a conventional semiconductor laser, a width of the diffraction grating drawing area 3 is as short as less than 5 mm in the light of improving a throughput in drawing diffraction gratings. Thus, when using electron beam lithography, crystal quality is significantly deteriorated due to formation of a concave in the drawing end 4 of the diffraction grating.

In contrast, in the structure of the semiconductor laser according to this embodiment, the electrode mesa structure 16 has a relatively larger width and the diffraction grating drawing area 3 also has a relatively larger width as described above, in the light of improving production stability. As a result, when using electron beam lithography, no drawing ends 4 do not remain within the electrode mesa structure 16.

It results in improved crystal quality in a semiconductor film such as the strained MQW active layer 6 formed on a diffraction grating. Thus, a semiconductor laser well-balanced in terms of production stability, a throughput in drawing diffraction gratings and crystal quality of an active layer can be consistently produced.

There will be described a manufacturing process for the semiconductor laser according to this embodiment.

Figure 2:
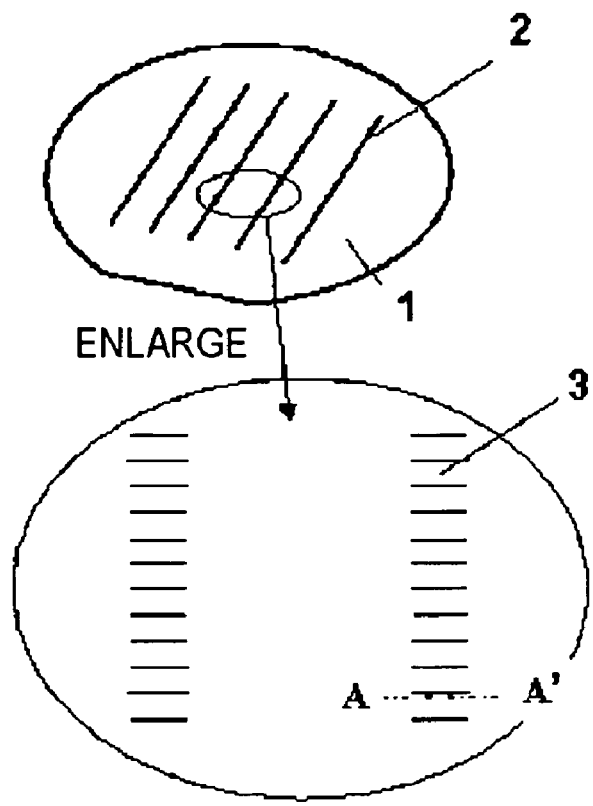
FIG. 2 schematically illustrates a process for forming a diffraction grating in a laser structure according to an embodiment.

As shown in FIG. 2, a resist for electron beam lithography was applied on an n-InP substrate 1, and a diffraction grating pattern was formed by an electron beam lithography apparatus. A period of a diffraction grating was 200 nm, a drawing width was 30 mm and a width of the diffraction grating drawing area 3 corresponding to a distance between semiconductor lasers was 300 mm.

Then, the substrate was etched with an HBr contained etchant using a pattern formed in the resist to form diffraction gratings 2 on the n-InP substrate 1. A concave bottom of the diffraction gratings 2 in the diffraction grating drawing area 3 had a depth of 45 nm.

Figure 3:
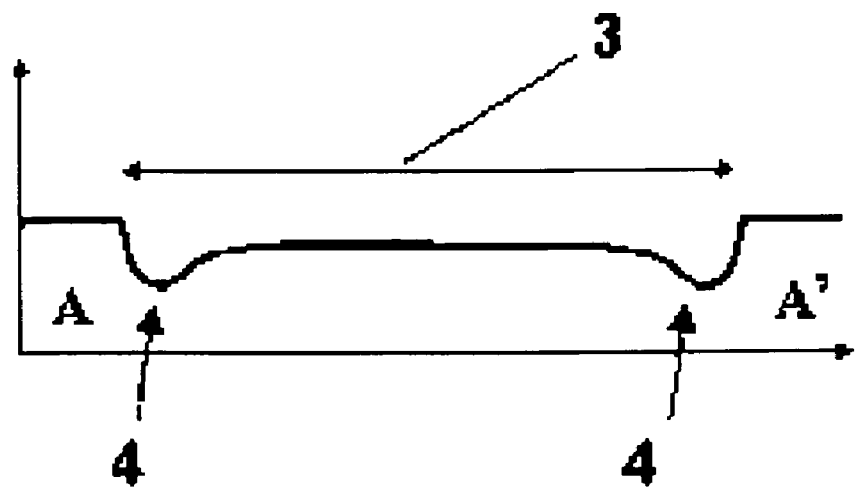
FIG. 3 is a cross-sectional view of the diffraction grating in the laser structure shown in FIG. 2.

FIG. 3 is a cross-sectional view of the diffraction grating drawing area 3 in this wafer taken on line A-A' of FIG. 2. It had a profile such that the cross section was deeper in the drawing ends 4 as shown in FIG. 3 and an average depth of the n-InP substrate 1 in the diffraction grating drawing area 3 was slightly larger than an area without a diffraction grating 2.

Figure 4:
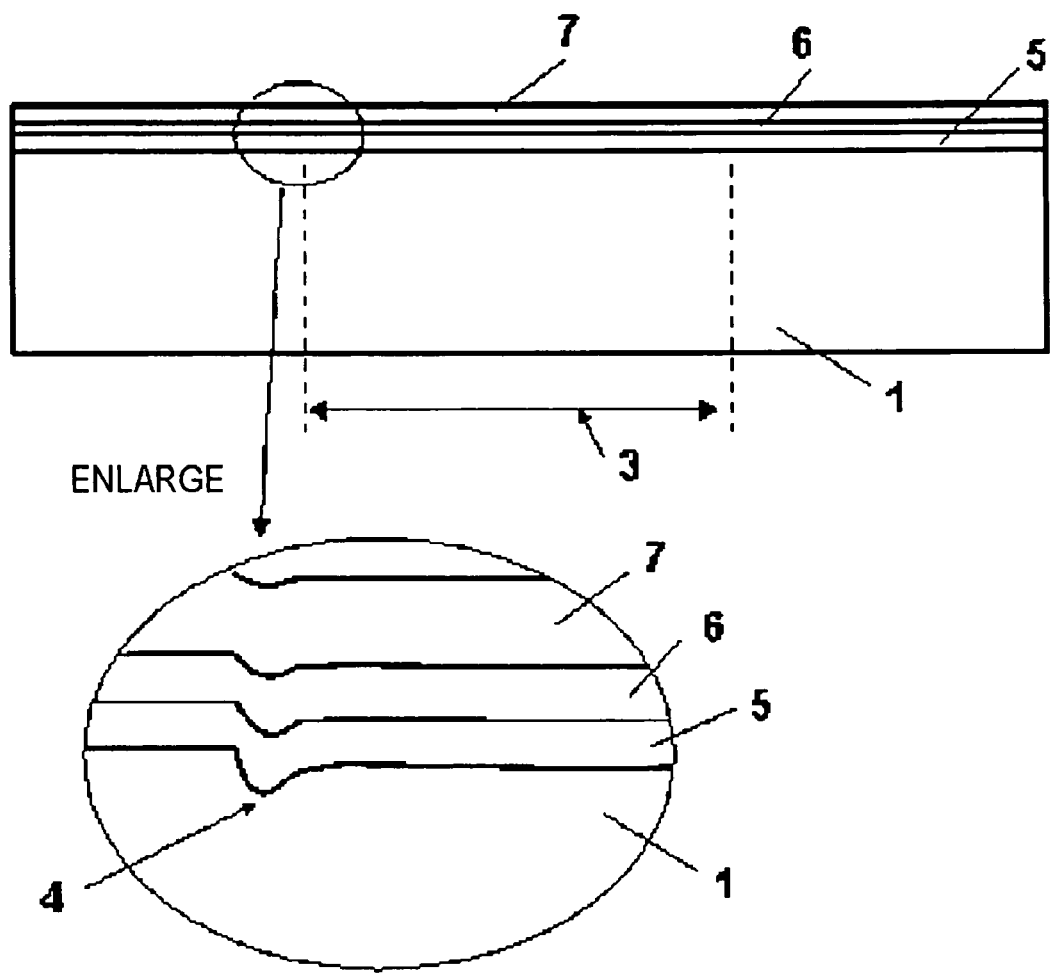
FIG. 4 is a process cross-sectional view illustrating a process for manufacturing a laser structure according to Embodiment 1.

Next, on the InP substrate 1 were grown an optical guide layer 5, a strained MQW active layer 6 made of InGaAsP and a p-InP layer 7 by MOVPE as shown in FIG. 4. A depth of the diffraction grating after burying was 30 nm.

Herein, as shown in FIG. 4, the area in the vicinity of the optical guide layer 5 and the drawing ends 4 in the strained MQW active layer 6 was constricted under the influence of a step in the n-InP substrate 1. Such a constriction, if remaining in the electrode mesa structure 16, may cause quality deterioration of the strained MQW active layer 6, leading to deterioration in device properties or reliability of a semiconductor laser.

Figure 5:
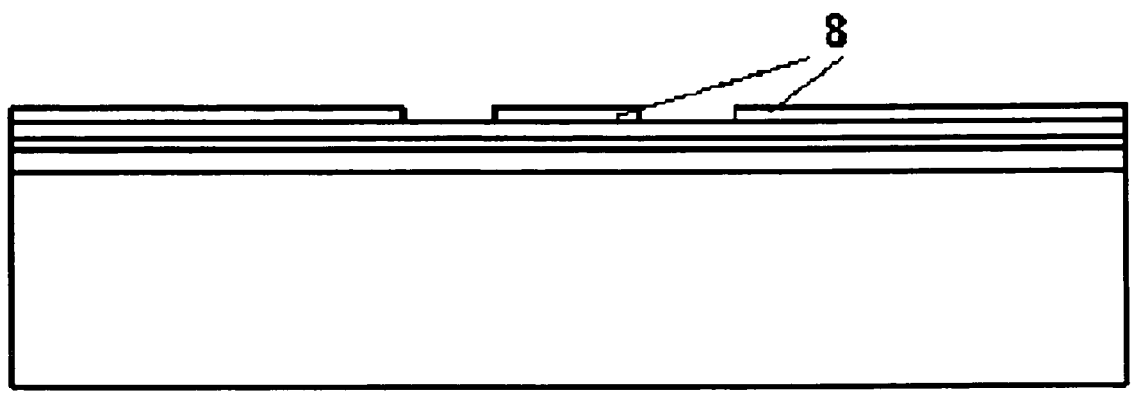
FIG. 5 is a process cross-sectional view illustrating a process for manufacturing a laser structure according to Embodiment 1.
Figure 6:
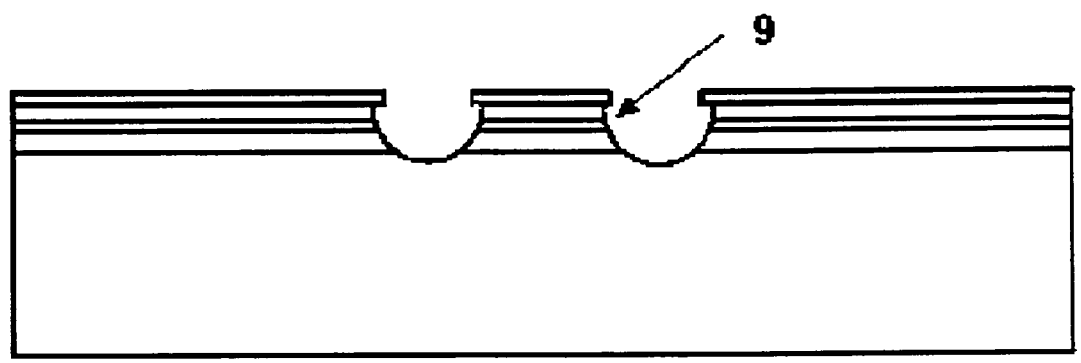
FIG. 6 is a process cross-sectional view illustrating a process for manufacturing a laser structure according to Embodiment 1.

Next, on the wafer was formed an SiO$_2$ film 8, which was then patterned as shown in FIG. 5. It was etched with an HBr contained etchant to form an active layer mesa structure 9 as shown in FIG. 6. Then, except the SiO$_2$ film 8 on the active layer mesa structure 9, the SiO$_2$ film 8 in the remaining area was removed.

Figure 7:
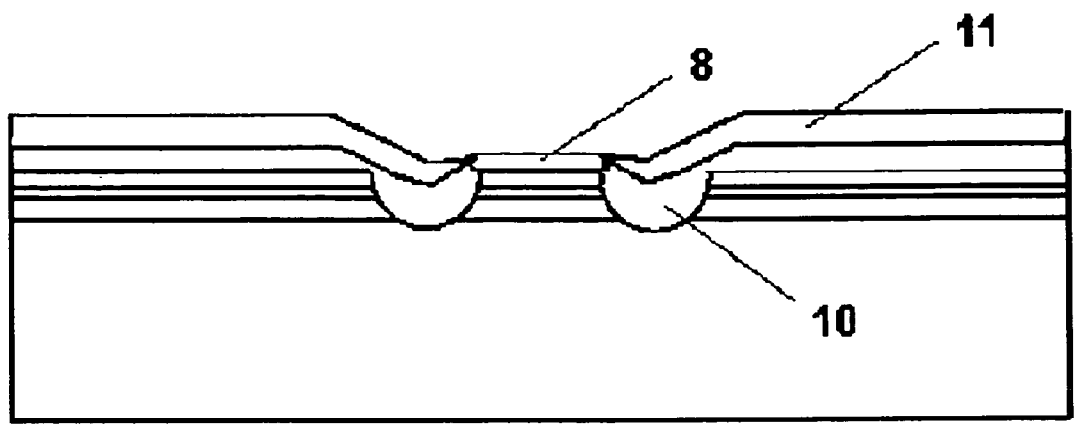
FIG. 7 is a process cross-sectional view illustrating a process for manufacturing a laser structure according to Embodiment 1.

Subsequently, a p-InP current block layer 10 and an n-InP current block layer 11 were formed by MOVPE as shown in FIG. 7. Then, the SiO$_2$ film 8 on the active layer mesa structure 9 was removed.

Figure 8:
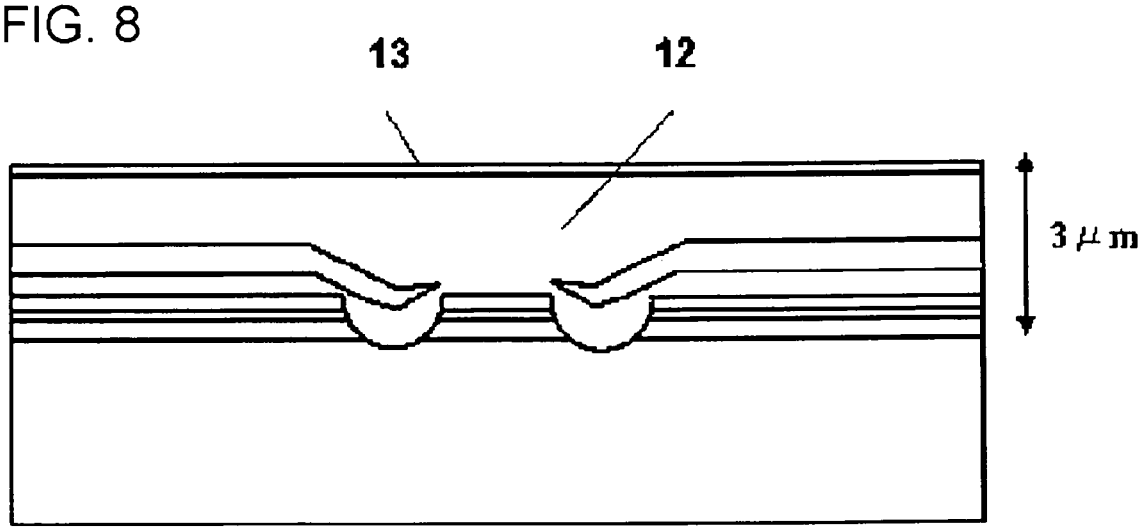
FIG. 8 is a process cross-sectional view illustrating a process for manufacturing a laser structure according to Embodiment 1.

Then, as shown in FIG. 8, an p-InP burying layer 12 and a p-InGaAs contact layer 13 were grown by MOVPE. After burying growth, a film thickness from the n-InP substrate 1 to the wafer surface was about 3 mm.

Figure 9:
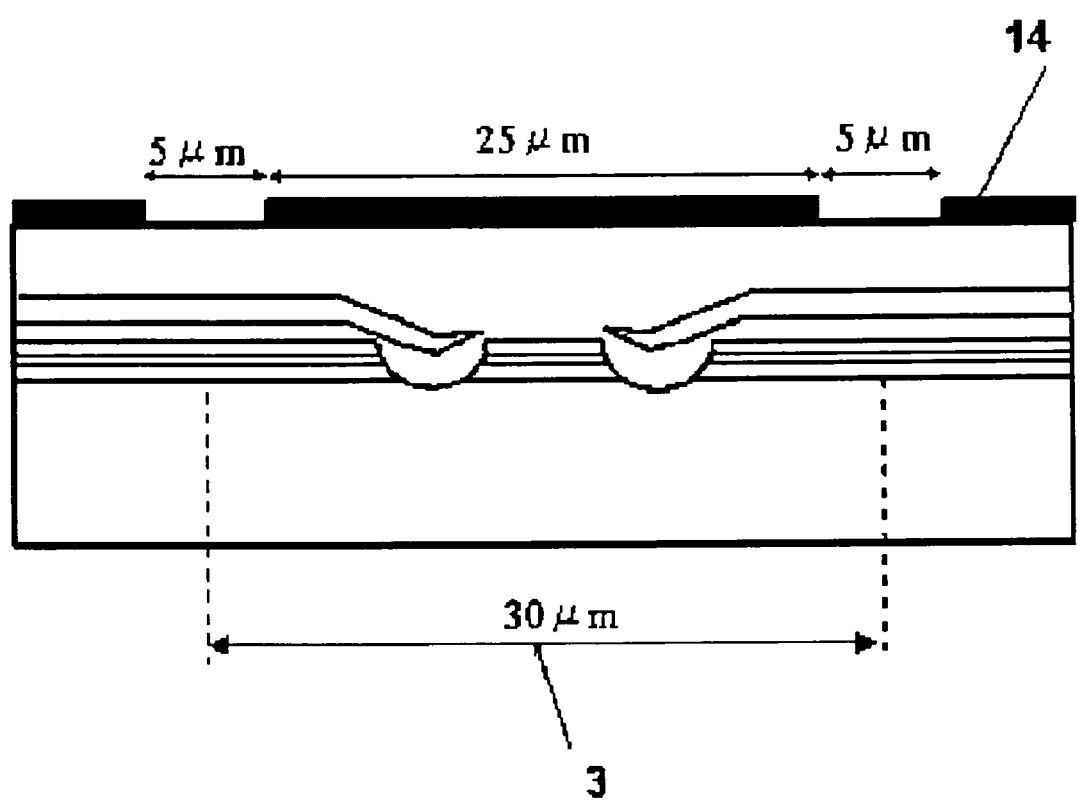
FIG. 9 is a process cross-sectional view illustrating a process for manufacturing a laser structure according to Embodiment 1.

A photoresist 14 was applied to the wafer as shown in FIG. 9 to form a pattern for etching. Here, a width of the photoresist 14 on the strained MQW active layer 6 was 25 mm while an opening width in an area to be etched was 5 mm in each side.

Figure 10:
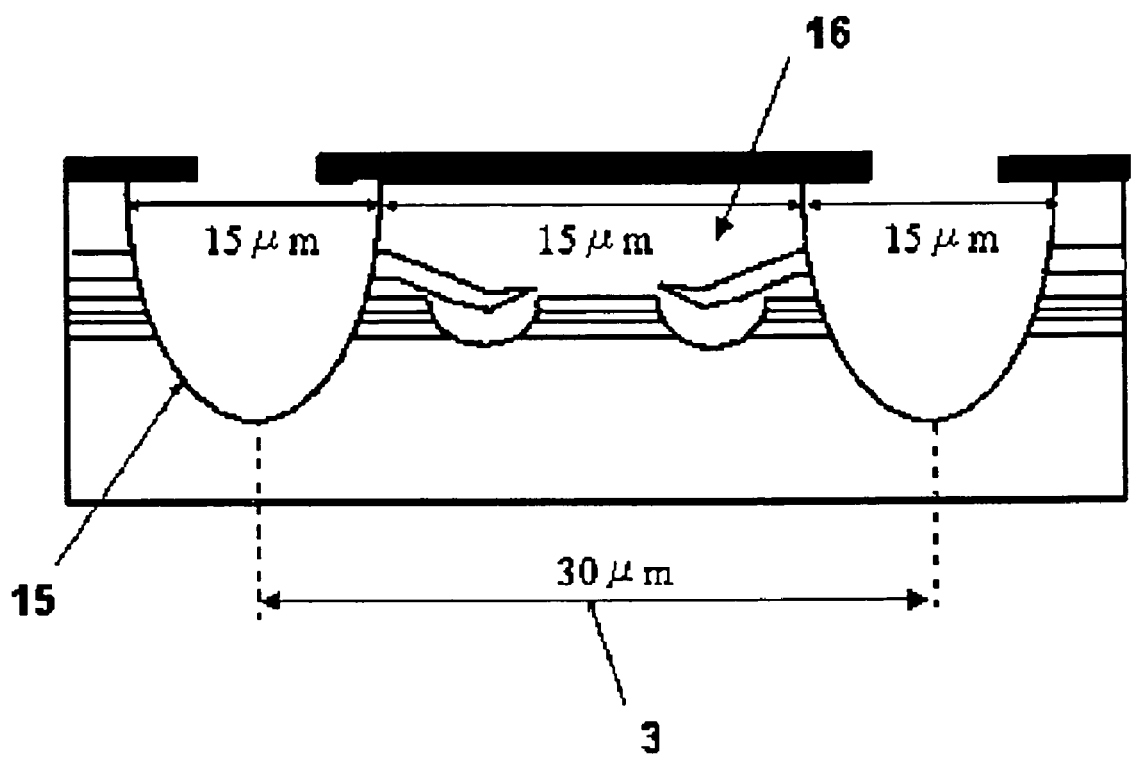
FIG. 10 is a process cross-sectional view illustrating a process for manufacturing a laser structure according to Embodiment 1.

Next, a groove 15 and an electrode mesa structure 16 was formed by etching with an HBr contained etchant as shown in FIG. 10. The mesa etching was continued until the electrode mesa structure 16 was side-etched to a width of 15 μm. Here, although a film thickness of a growth layer on the n-InP substrate 1 was 3 μm while, the groove 15 reached the inside of the n-InP substrate 1 because the groove 15 could be formed to a depth of 5 μm by etching.

In this process, the drawing ends 4 on the n-InP substrate 1 and the area with insufficient crystal quality grown thereon were simultaneously etched off. Thus, within the electrode mesa structure 16 where a current is applied, there are no drawing ends 4 or areas with poor crystal quality due to the ends.

Next, a SiO$_2$ film 17 was formed. After forming a window, a p-electrode 18 and an n-electrode 19 were formed. The wafer was cleaved such that a cavity had a length of 250 mm. Then, anti-reflective coating was formed on the front facet while the rear surface was coated with a reflectivity of 75%, to provide a semiconductor laser as shown in FIG. 1.

The effects of the configuration according to this embodiment will be described.

The prepared DFB laser (semiconductor laser) oscillated with a threshold of 6 mA at 25° C. and of 20 mA even at 85° C. The laser was evaluated by an APC current application test at 85° C. and 10 mW, to show an average lifetime of 100,000 hours or more.

In the above semiconductor laser, such highly stable quality was achieved because no drawing ends 4 remained within the electrode mesa structure 16 so that a current did not flow in an area with poor crystal quality and thus properties or reliability of the semiconductor laser were not adversely affected.

In the prior art, rather than electron beam lithography, an holographic lithography method where a diffraction grating pattern is formed by laser holographic or a pattern grading method where a pattern is formed in a resist by transferring a pattern formed in a mask by exposure via the mask has been used. In these methods, the phenomenon does not significantly occur, in which a concave bottom in diffraction grating in a drawing end of the diffraction grating is lower than a concave bottom in a diffraction grating in the remaining area.

In contrast, since this embodiment employed electron beam lithography, formation of a concave in the drawing ends 4 is significant as shown in FIG. 4. Thus, when a concave is formed in the drawing ends 4, a step in the upper surface of the n-InP substrate 1 in the vicinity of the drawing ends 4 becomes more significant. Thus, under the influence of the step in the n-InP substrate 1, concaves are similarly formed to give a constricted shape in the areas in the vicinity of the drawing ends 4 in the optical guide layer 5, the strained MQW active layer 6 and the p-InP layer 7 deposited on the n-InP substrate 1.

When the constricted shapes in the optical guide layer 5, the strained MQW active layer 6 and the p-InP layer 7 remain within the electrode mesa structure 16, they may cause quality deterioration such as deteriorated crystal quality in a semiconductor material including the optical guide layer 5, the strained MQW active layer 6 and the p-InP layer 7, leading to deterioration in properties or reliability such as a luminous efficiency of a semiconductor laser device and single mode properties.

However, in this embodiment, two grooves 15 are formed to remove an area in the vicinity of the drawing ends 4. Thus, these two grooves 15 remove concaves or constrictions in the n-InP substrate 1, the optical guide layer 5, the strained MQW active layer 6 and/or the p-InP layer 7.

As a result, remaining of an area with poor crystal quality can be controlled in the electrode mesa structure 16, so that properties such as a luminous efficiency in a semiconductor laser device and single mode properties at an emission wavelength and reliability can be consistently improved.

In other words, according to the manufacturing process for a semiconductor device of this embodiment, the drawing ends 4 on the diffraction grating forming surface are removed by the pair of grooves 15 or are separated from the area to be current-injected by the pair of grooves 15. Thus, a proportion of an area with poor crystal quality is reduced in the area to be current-injected, so that a high-quality semiconductor laser can be consistently provided.

Embodiment 2

Figure 11:
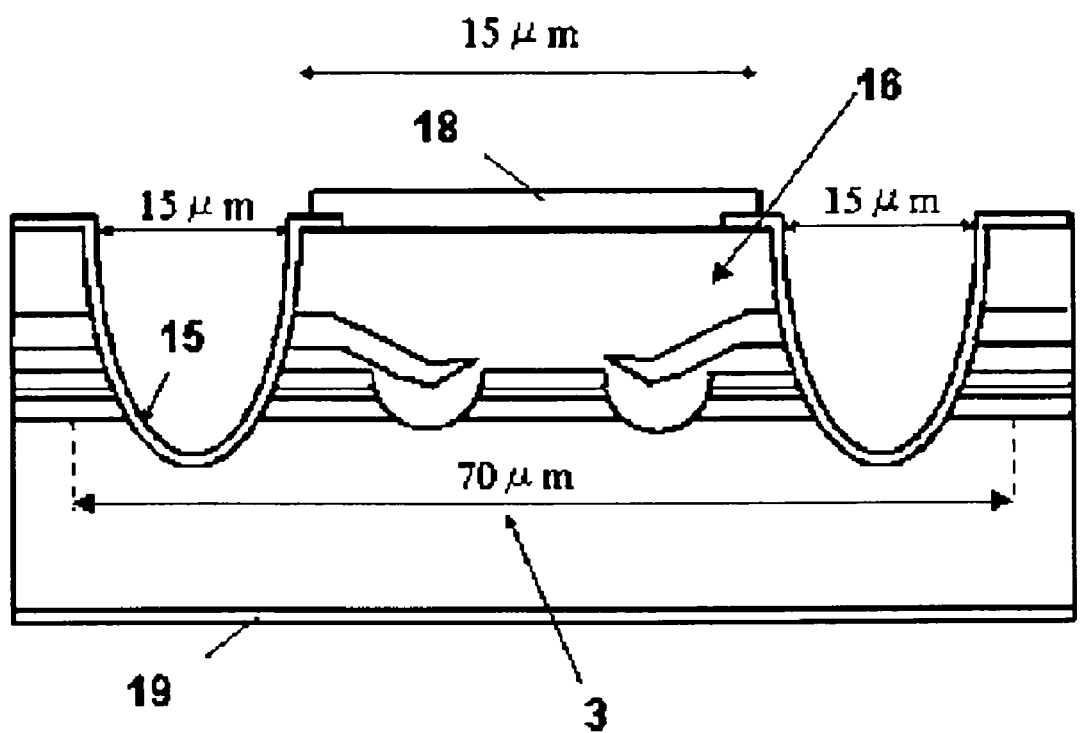
FIG. 11 is a cross-sectional view illustrating a laser structure according to Embodiment 2.

A semiconductor laser according to this embodiment will be described with reference to FIG. 11. In this embodiment, a laser was prepared as described in Embodiment 1, except that a diffraction grating drawing width 3 was increased to 70 μm.

Although the drawing ends 4 are not removed during the step of forming an electrode mesa structure 16 by etching, they are separated by the two grooves 15, so that a current is never injected to an area outside these two grooves 15. Thus, there is provided a semiconductor laser with excellent properties and reliability as is in Embodiment 1.

Furthermore, in addition to the effects described in Embodiment 1, Embodiment 2 has a unique advantage that an exposure time in electron beam lithography is increased while allowance for alignment precision in exposure during forming the electrode mesa structure 16 can be increased because the diffraction grating drawing width 3 is larger than that in Embodiment 1.

For example, when a strained MQW active layer 6 is considerably strained, a wafer may be curved. In such a case, alignment precision may be reduced in the step of forming the electrode mesa structure 16 and therefore, it may be difficult to align the two grooves 15 with the drawing ends of a diffraction grating.

In such a case, when the drawing ends 4 are formed such that they are adequately distant from the electrode mesa structure 16 as in this embodiment, semiconductor laser properties may be improved, including improved crystal quality in the strained MQW active layer 6 as in the case where the drawing ends 4 are removed, while further improving production stability for the semiconductor laser.

In this configuration, there are diffraction gratings formed outside at least one of the two grooves 15 to a p-electrode 18. Thus, there are no drawing ends 4 in the electrode mesa structure 16. Therefore, a proportion of an area with deteriorated crystal quality in the electrode mesa structure 16 is reduced so that a high-quality semiconductor laser can be consistently manufactured.

In the edge outside the two grooves 15, the concave bottom of the diffraction grating has an area lower than the concave bottom of a diffraction grating in the remaining area. As a result, outside the electrode mesa structure 16, there exists an area lower than the concave bottom of the diffraction grating in the remaining area. Therefore, a proportion of an area with deteriorated crystal quality in the electrode mesa structure 16 is reduced so that a high-quality semiconductor laser can be consistently manufactured.

Embodiment 3

This embodiment will be described with reference to FIGS. 12 to 17. Although a buried-heterostructure semiconductor laser has been described in Embodiments 1 and 2, application of this invention to a ridge waveguide type laser will be described in this embodiment. The semiconductor laser of this embodiment has a basic structure as in the semiconductor laser described in Embodiment 1 or 2.

Figure 12:
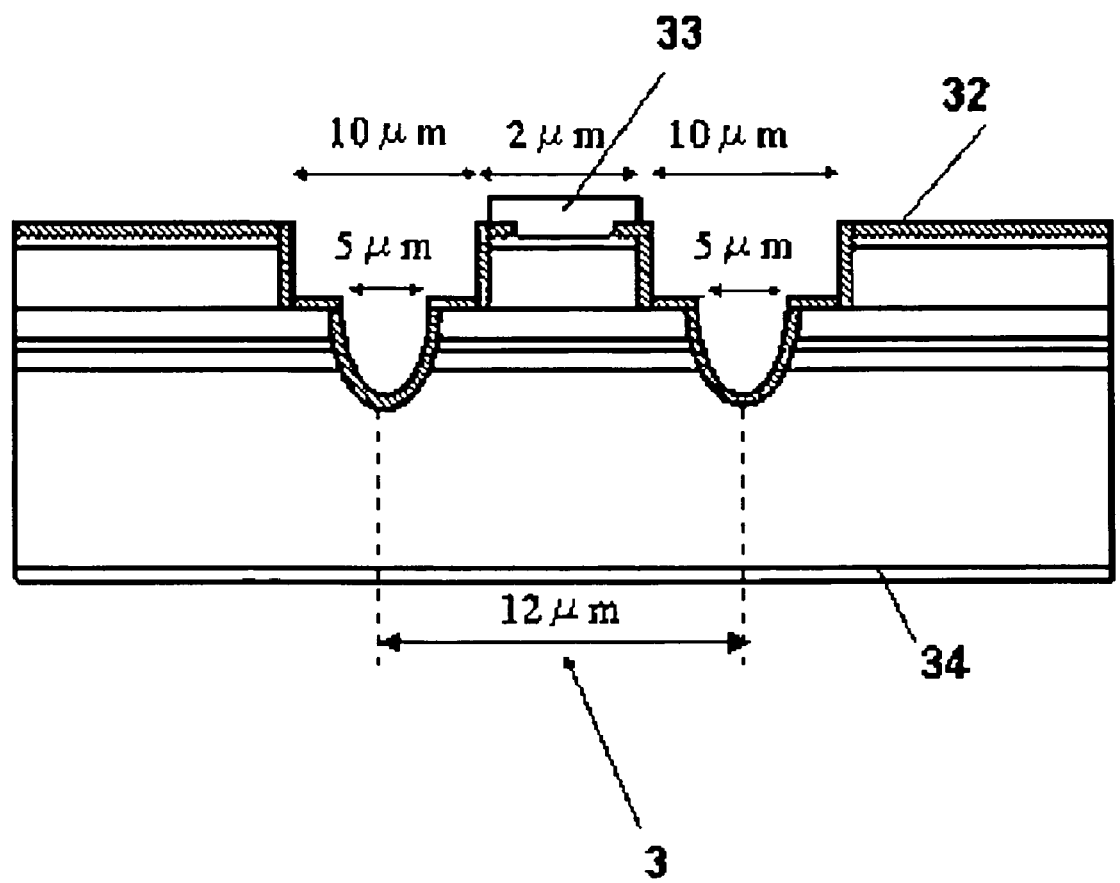
FIG. 12 is a cross-sectional view illustrating a laser structure according to Embodiment 3.

FIG. 12 shows the structure of the semiconductor laser according to Embodiment 3. In FIG. 12, a diffraction grating drawing width 3 is 12 μm, a ridge waveguide width is 2 μm, and there are formed the first groove with a width of 10 μm on both sides and the second groove with a width of 5 μm which is formed in the first groove and separates a strained MQW active layer 6. In this structure, a diffraction grating surface sandwiched by the second grooves has a width of 5 μm or more.

Again, this structure has no drawing ends 4 in the diffraction grating forming surface. Therefore, in the ridge electrode structure as an area to be current-injected, a proportion of an area with poor crystal quality is reduced, so that a high-quality semiconductor laser can be consistently manufactured as in Embodiments 1 and 2.

In contrast to Embodiment 1 or 2, this embodiment has a configuration that the multilayer film sandwiched by the two first grooves 29 has a ridge type structure. Thus, an optical waveguide structure is formed where light is confined in the strained MQW active layer 6 in the ridge type structure and a current is simultaneously confined. Therefore, a semiconductor laser capable of good oscillation in a single mode can be consistently provided.

There will be described a manufacturing process for a semiconductor laser according to this embodiment.

Figure 13:
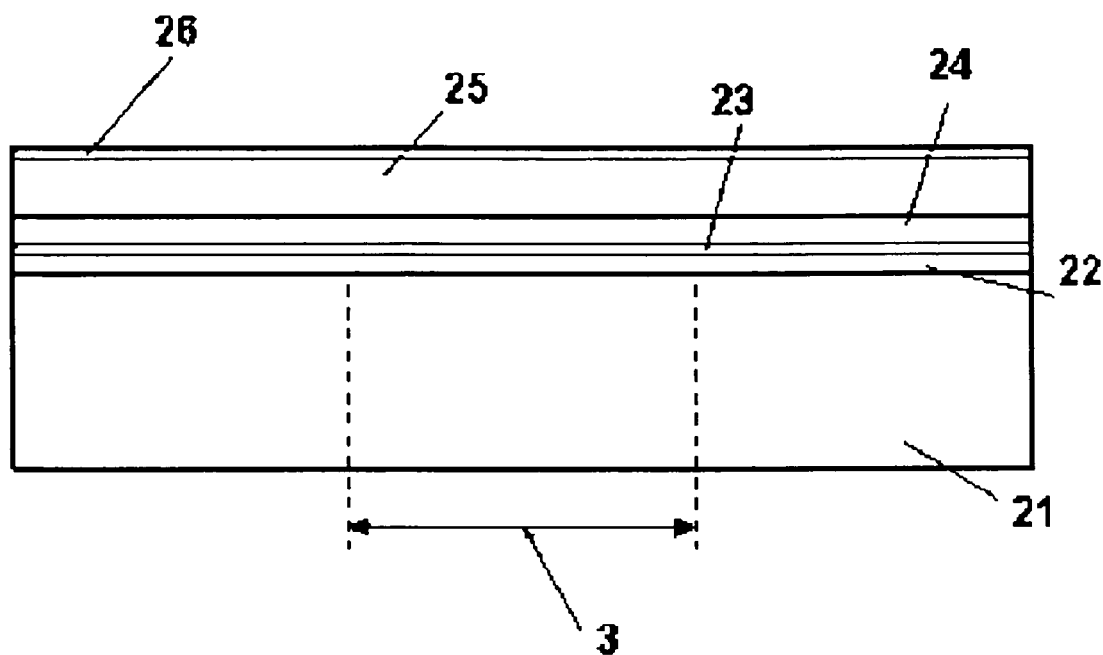
FIG. 13 is a process cross-sectional view illustrating a process for manufacturing a laser structure according to Embodiment 3.

As shown in FIG. 13, on an n-InP substrate 21 comprising diffraction gratings formed by electron beam lithography are grown an n-InGaAsP optical guide layer 22, an AlGaInAs strained MQW active layer 23, a p-InGaAsP etching stop layer 24, a p-InP layer 25 and a p-InGaAs contact layer 26 by MOVPE.

Figure 14:
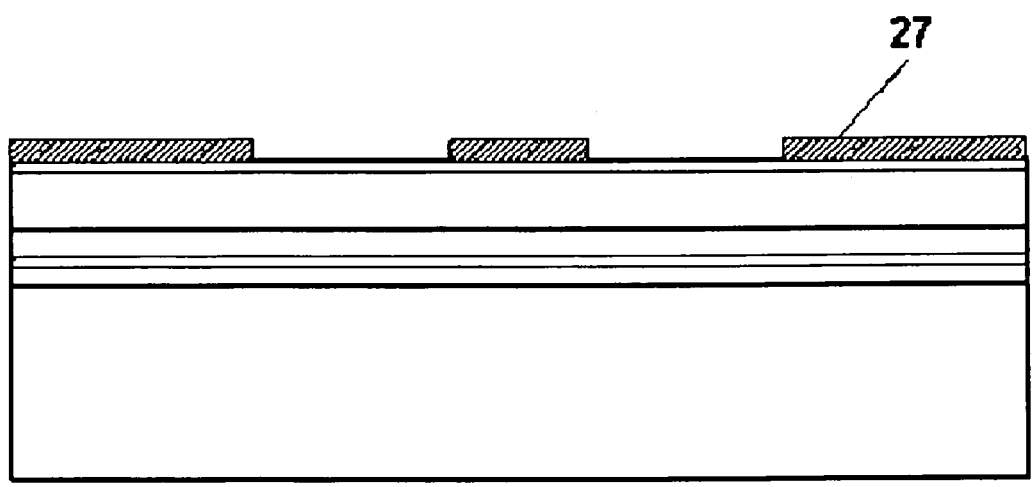
FIG. 14 is a process cross-sectional view illustrating a process for manufacturing a laser structure according to Embodiment 3.

Next, on the grown wafer are formed a ridge 28 and a mask pattern of an SiO$_2$ film 27 for forming the first groove 29 as shown in FIG. 14. Using the pattern, the wafer is etched by a hydrochloric acid contained etchant to form a ridge 28.

Figure 15:
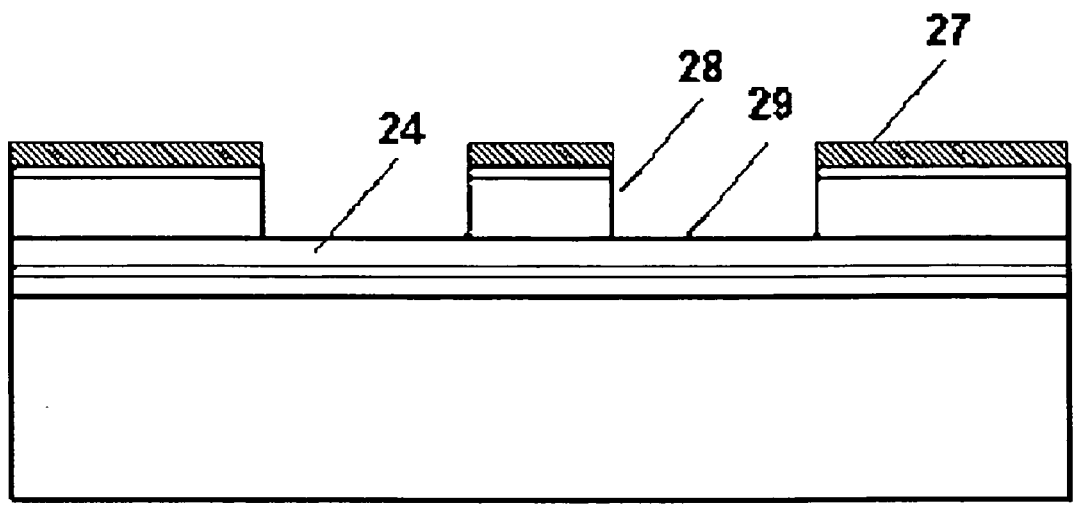
FIG. 15 is a process cross-sectional view illustrating a process for manufacturing a laser structure according to Embodiment 3.

As a result, etching is stopped when it reaches the p-InGaAsP etching stop layer 24 as shown in FIG. 15.

Figure 16:
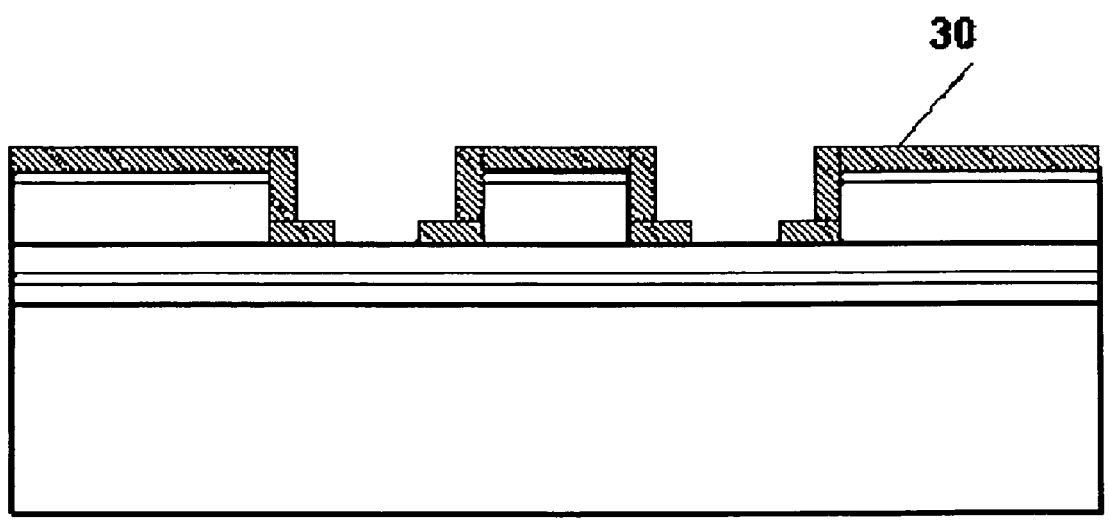
FIG. 16 is a process cross-sectional view illustrating a process for manufacturing a laser structure according to Embodiment 3.

Furthermore, to the wafer is applied a photoresist 30, to form a pattern for forming the second groove in the first groove 29 as shown in FIG. 16.

Figure 17:
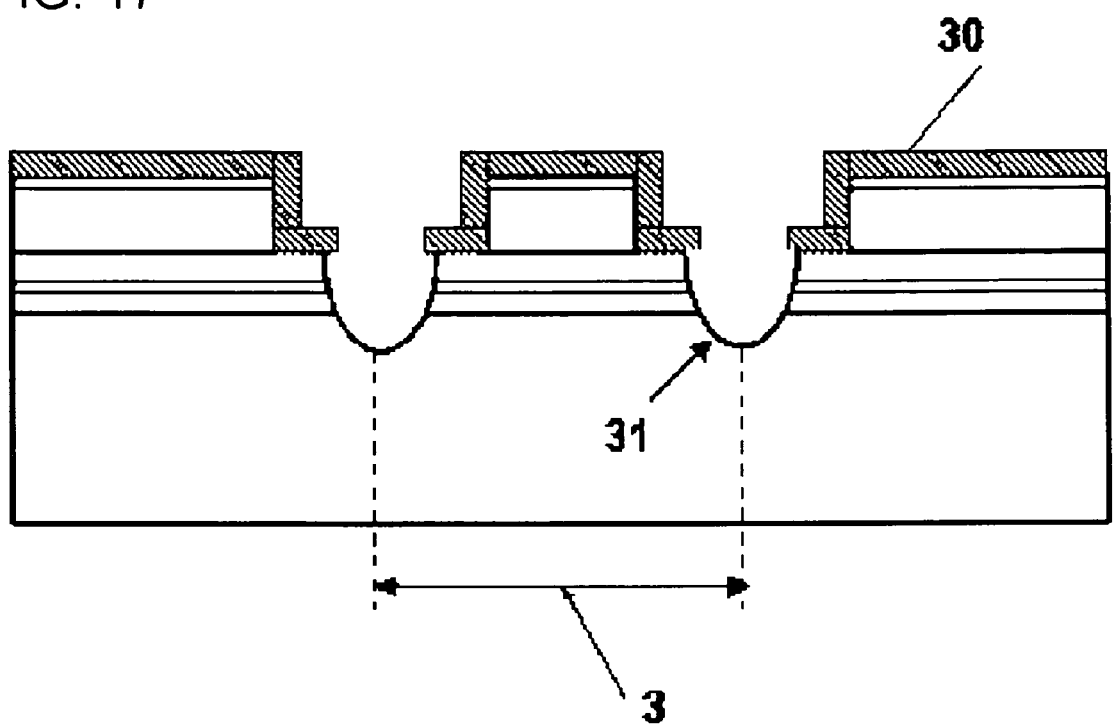
FIG. 17 is a process cross-sectional view illustrating a process for manufacturing a laser structure according to Embodiment 3.

Next, the wafer is etched by an HBr contained etchant to form the second groove 31 as shown in FIG. 17. Here, etching is continued until the second groove 31 reaches inside of the n-InP substrate 21. During the etching, an area in the vicinity of the drawing ends of a diffraction grating is removed. Then, an SiO$_2$ film 32 is formed. After forming a window, a p-electrode 33 and an n-electrode 34 are vapor-deposited to provide a semiconductor laser as shown in FIG. 12.

Again, in this process, the drawing ends 4 on the diffraction grating forming surface are removed by the two first grooves 29. Thus, in the ridge electrode structure, a proportion of an area with poor crystal quality is reduced so that a high-quality semiconductor laser can be consistently manufactured as in Embodiments 1 and 2.

Some configurations of this invention have been described, but these may be arbitrarily combined, and such a combination may be effective as an aspect of this invention. Furthermore, an expression of this invention in any other category may be effective as an aspect of this invention.

For example, the above embodiments illustrate a semiconductor laser having a mesa or ridge electrode structure, but an electrode may have another type of structure. For example, a semiconductor laser may have a reverse mesa electrode structure. In this configuration, diffraction gratings may be formed over the whole diffraction grating forming surface sandwiched by two grooves to consistently provide a high-quality semiconductor laser because there are no drawing ends of a diffraction grating in the reverse mesa electrode structure.

It is apparent that the present invention is not limited to the above embodiment, that may be modified and changed without departing from the scope and spirit of the invention.

What is claimed is:

1. A process for manufacturing a semiconductor laser comprising:
    forming a multilayer film including an active layer on a semiconductor substrate;
    separating the multilayer film to form a pair of grooves extending into the semiconductor substrate; and
    forming an electrode on the multilayer film between the pair of grooves,
    wherein said forming the multilayer film on the semiconductor substrate comprises forming a plurality of diffraction gratings on a diffraction grating forming surface formed partially in an upper surface of the semiconductor substrate or an upper surface of any of the semiconductor films in the multilayer film,
    wherein said forming the pair of grooves comprises forming a plurality of diffraction gratings in entirely only a first area from one to another of the pair of the grooves, or forming a plurality of diffraction gratings in entirely the first area and in less than an entirety of a second area outside of the pair of grooves, and
    wherein when said forming the pair of grooves comprises forming a plurality of diffraction gratings in entirely the first area and partially a second area outside of the pair of grooves, said forming the pair of grooves comprises forming the plurality of diffraction gratings comprising forming diffraction gratings being in contact with the pair of grooves in the second area.

2. The process for a semiconductor laser as claimed in claim 1, wherein said forming the plurality of diffraction gratings comprises forming a plurality of diffraction gratings in the diffraction grating forming surface by electron beam lithography.

3. The process for a semiconductor laser as claimed in claim 1, further comprising forming a pair of current blocking areas separating the multilayer film and extending to the semiconductor substrate in the area between the pair of grooves.

4. The process for a semiconductor laser as claimed in claim 1, wherein said forming the pair of grooves comprises forming the pair of grooves such that a distance between centers of the pair of grooves is 10 μm or more.

5. The process for a semiconductor laser as claimed in claim 1, wherein said forming the plurality of diffraction gratings comprises forming the plurality of diffraction gratings such that the plurality of diffraction gratings have a length of 5 μm or more.

6. A semiconductor laser comprising:
    a semiconductor substrate;
    a multilayer film including an active layer on the semiconductor substrate;
    an electrode on the multi layer film;
    a pair of grooves separating the multilayer film in both edges of the electrode and extending to the semiconductor substrate; and
    a plurality of diffraction gratings formed in entirely only a first area from one to an other of the pair of grooves in a diffraction grating forming surface formed in an upper surface of the semiconductor substrate or an upper surface of any of the semiconductor films in the multilayer film, or formed in entirely the first area and in less than an entirety of a second area outside of the pair of grooves,
    wherein said pair of grooves separates an area to be current injected from a drawing end of said diffraction gratings.

7. The semiconductor laser as claimed in claim 6, wherein a depth of the plurality of diffraction gratings in the first area is substantially constant.

8. The semiconductor laser as claimed in claim 6, wherein when the plurality of diffraction gratings are formed in the first area and a second area, the depth of the plurality of diffraction gratings formed in the second area is deeper than that of the plurality of diffraction gratings in a remaining area.

9. The semiconductor laser as claimed in claim 6, wherein the multilayer film is separated in the first area to further form a pair of current blocking areas extending to the semiconductor substrate.

10. The semiconductor laser as claimed in claim 6, wherein a distance between centers of the pair of grooves is 10 μm or more.

11. The semiconductor laser as claimed in claim 6, wherein a width of the diffraction grating forming surface is 5 μm or more.

12. The semiconductor laser as claimed in claim 6, wherein the semiconductor laser comprises a distributed feedback type semiconductor laser.

13. The semiconductor laser as claimed in claim 6, wherein when the plurality of diffraction gratings are formed in the first area and the second area, the plurality of diffraction gratings comprise diffraction gratings being in contact with the pair of grooves in the second area.

14. The semiconductor laser as claimed in claim 6, wherein the first area is devoid of a drawing end of said diffraction gratings.

15. The semiconductor laser as claimed in claim 6, wherein said plurality of diffraction gratings contact said pair of grooves.

16. The semiconductor laser as claimed in claim 6, wherein said plurality of diffraction gratings directly contact each of said grooves.

* * * * *